(12) United States Patent
Poole et al.

(10) Patent No.: US 6,246,312 B1
(45) Date of Patent: Jun. 12, 2001

(54) BALL GRID ARRAY RESISTOR TERMINATOR NETWORK

(75) Inventors: David L. Poole, Portland; Robert L. Reinhard, Berne; Richard O. Cooper, Bluffton, all of IN (US); Richard S. DeMars, Three Rivers, MI (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 09/620,396

(22) Filed: Jul. 20, 2000

(51) Int. Cl.[7] ................................................. H01C 1/012
(52) U.S. Cl. ........................... 338/307; 338/320; 338/325
(58) Field of Search ..................................... 338/320, 324, 338/325, 327, 329, 309, 260, 239, 307

(56) References Cited

U.S. PATENT DOCUMENTS

| | | |
|---|---|---|
| 4,300,115 | 11/1981 | Ansell . |
| 4,654,628 | 3/1987 | Takayanagi . |
| 4,658,234 | 4/1987 | Takayanagi . |
| 4,791,473 | 12/1988 | Phy . |
| 4,933,741 | 6/1990 | Schroeder . |
| 4,945,399 | 7/1990 | Brown . |
| 4,992,628 | 2/1991 | Beppu . |
| 5,029,325 | 7/1991 | Higgins . |
| 5,140,407 | 8/1992 | Kamada . |
| 5,142,351 | 8/1992 | Matta . |
| 5,216,404 | 6/1993 | Nagai . |
| 5,220,199 | 6/1993 | Owada . |
| 5,255,839 | 10/1993 | Da Costa Alves . |
| 5,272,590 | 12/1993 | Hernandez . |
| 5,352,926 | 10/1994 | Andrews . |
| 5,371,405 | 12/1994 | Kagawa . |
| 5,379,190 | 1/1995 | Hanamura . |
| 5,382,827 | 1/1995 | Wang . |
| 5,400,220 | 3/1995 | Swamy . |
| 5,420,460 | 5/1995 | Massingill . |
| 5,424,492 | 6/1995 | Petty . |
| 5,467,252 | 11/1995 | Nomi . |
| 5,491,303 | 2/1996 | Weiss . |
| 5,509,200 | 4/1996 | Frankeny . |
| 5,528,083 | 6/1996 | Malladi . |
| 5,530,288 | 6/1996 | Stone . |
| 5,539,186 | 7/1996 | Abrami . |
| 5,557,502 | 9/1996 | Banerjee . |
| 5,559,363 | 9/1996 | Immorlica . |
| 5,574,630 | 11/1996 | Kresge . |
| 5,607,883 | 3/1997 | Bhattacharya . |
| 5,621,619 | 4/1997 | Seffernick . |
| 5,661,450 | 8/1997 | Davidson . |
| 5,729,438 | 3/1998 | Pieper . |
| 5,977,863 | 11/1999 | Bloom . |

*Primary Examiner*—Michael L. Gellner
*Assistant Examiner*—Richard K. Lee
(74) *Attorney, Agent, or Firm*—Mark P. Bourgeois; Mark W. Borgman

(57) ABSTRACT

A resistor network for terminating active electronic circuits such as stub series terminated logic and emitter coupled logic circuits. The network has a substrate with top and bottom surfaces and a common via extending through the substrate. Several resistor pairs are located on the first surface surrounding the common via. Each resistor pair has first and second vias. Resistors are connected between the first and second vias. Several solder spheres are located on the bottom surface. Each of the solder spheres are electrically connected to one of the first, second or common vias.

2 Claims, 3 Drawing Sheets

BALL GRID ARRAY RESISTOR TERMINATOR NETWORK

BACKGROUND

1. Field of the Invention

This invention generally relates to resistors for impedance matching terminations in electronics. Specifically, the invention is a group of impedance matching or terminating resistors mounted in a high density network or array package using spherical solder connections and having low noise characteristics.

2. Description of the Related Art

Resistor networks are commonly used to terminate high speed digital signal lines to minimize unwanted reflections back through the transmission structure which is typically a printed circuit board. In most applications, the terminations are made by placing a resistor with a resistance matching the impedance of the transmission line, at the end of the transmission line. One end of the resistor is connected to a common termination voltage and the other end is connected to the signal line. For these applications, a bussed resistor network is a convenient solution, since at least one end of the termination is common to all signal lines.

The previous resistor network designs including surface mount, SIP and DIP versions have had resistors and conductor arrangements with individual conductor lines running for a length of some distance on the network before being tied to a common point. This is necessitated because all the external off resistor network connections are made at the periphery of the device and a conductor must be run from the periphery of the device to the individual resistor. The lengthy line length causes each resistor/conductor pair to have a higher mutual inductance between adjoining resistor/conductor pairs and leads to significant cross-talk noise being coupled between the resistor/conductor pairs when the resistor network is employed in its typical use as a terminating or impedance matching resistor for simultaneously switching transistors in an electronic device. As the transistor density and speed of semiconductor devices increase, the problem of cross-talk noise causing an erroneous signal becomes more of a problem in all areas of the electronic package and must be taken into consideration when designing electronic packaging. Further, at high frequencies, the high inductance of the common termination lines can cause a high impedance to appear at the end of the transmission line.

U.S. Pat. No. 5,977,863 provides a resistor network with lower inductance and noise for resistor networks that several inputs tied to a common termination voltage.

Certain circuit designs require specialized termination schemes. For example, in stub series terminated logic circuits two resistors are needed for termination of each data line. The signal is connected through one of the resistors and the termination voltage is connected through another resistor. In another example, emitter coupled logic circuits require two resistors for termination. The resistors are connected together and the data line is connected to the junction of the resistors. The other ends of the resistors are connected to two different termination voltages.

There is a current unmet need for a resistor terminator network for emitter coupled logic and stub series terminated logic with higher density, low cross-talk noise and improved signal integrity.

SUMMARY

It is a feature of the invention to provide a resistor network for terminating active electronic devices that has low noise and high density.

It is a feature of the invention to provide a resistor termination network for stub series terminated logic circuits. The network includes a substrate having a first and a second surface and a common via extending through the substrate. A plurality of resistor pairs are located on the first surface surrounding the common via. Each resistor pair has a first via that extends through the substrate and a second via that extends through the substrate. A first resistor is connected between the first and second vias. A second resistor is connected between the second and common vias. Several solder spheres are disposed on the second surface. Each of the solder spheres are electrically connected to one of the first, second or common vias.

Another feature of the invention is to provide a resistor termination network for terminating emitter coupled logic circuits. The network has a substrate with a first and a second surface. A common via extends through the substrate. The common via is connected to a first termination voltage.

A first group of resistors is located on the first surface surrounding the common via. Each resistor has a first end and a second end connected to the common via. A first group of vias extends through the substrate and is connected to the second ends. The first group of vias are connected to a data line. A second group of resistors are located on the first surface in proximity to the first group of vias, each having a third end and a fourth end. The third ends are connected to the first group of vias, respectively. A second group of vias extend through the substrate and are connected to the fourth ends. The second group of vias are connected to a second termination voltage. Several solder spheres are disposed on the second surface, each of the solder spheres are electrically connected to one of the first, or second group of vias or the common via.

The invention resides not in any one of these features per se, but rather in the particular combination of all of them herein disclosed and claimed and it is distinguished from the prior art in this combination of all of its structures for the functions specified.

There has thus been outlined, rather broadly, the more important features of the invention so that the detailed description thereof that follows may be better understood, and so that the present contribution to the art may be better appreciated. There are, of course, additional features of the invention that will be described hereinafter and which will form the subject matter of the appended claims. Those skilled in the art will appreciate that the preferred embodiment may readily be used as a basis for the designing of other structures, methods and systems for carrying out the several purposes of the present invention. It is important, therefore, that the claims are regarded as including such equivalent constructions in that they do not depart from the spirit and scope of the present invention.

It is noted that the drawings of the invention are not to scale. The description of the invention may contain, for example, such descriptive terms as up, down top, bottom, right or left. These terms are meant to provide a general orientation of the parts of the invention and are not meant to be limiting as to the scope of the invention.

DETAILED DESCRIPTION OF THE PREFERRED EMBODIMENT

Figure 1:
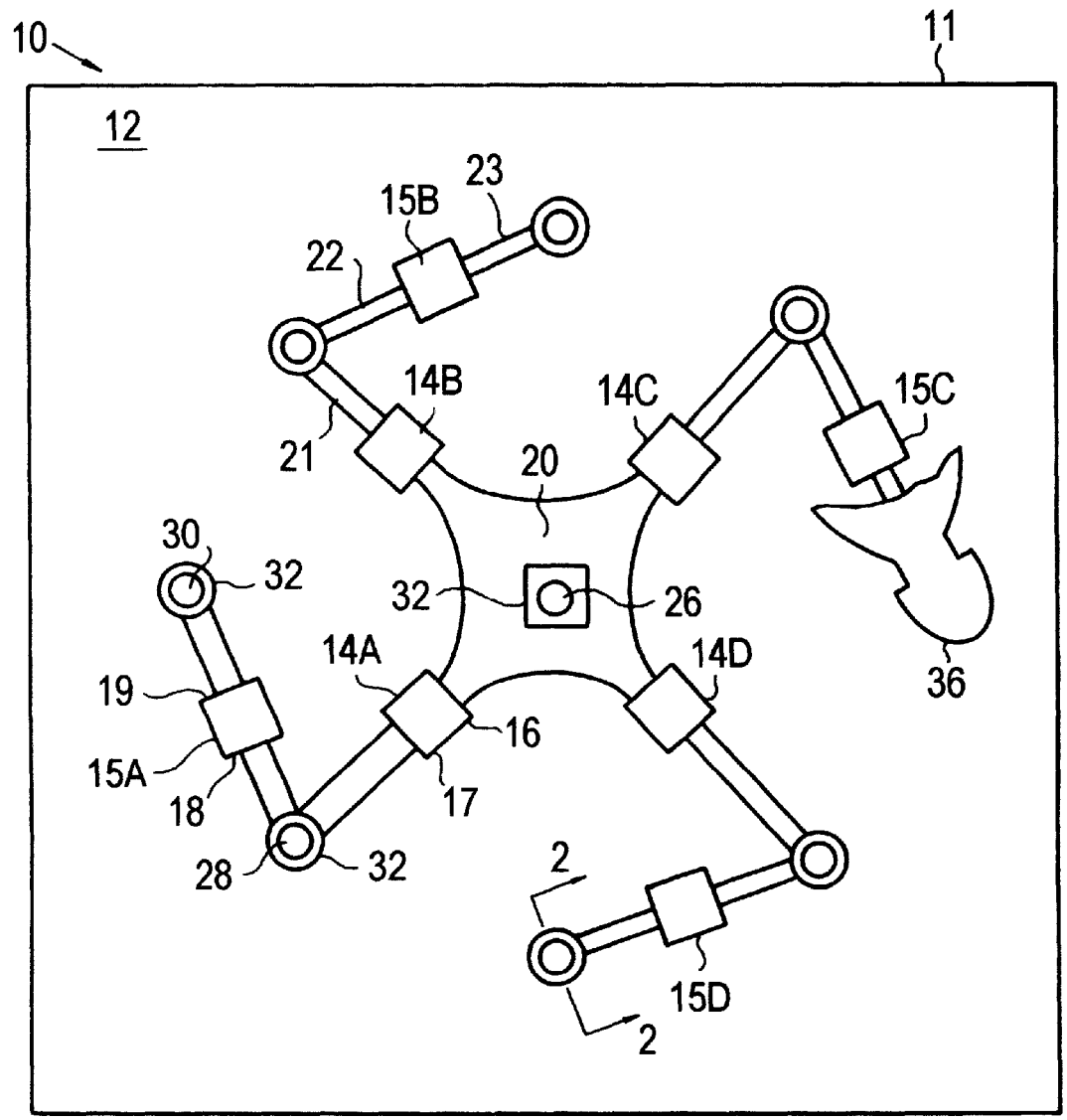
FIG. 1 is a top view of a stub series terminated logic ball grid array resistor network.
Figure 2:
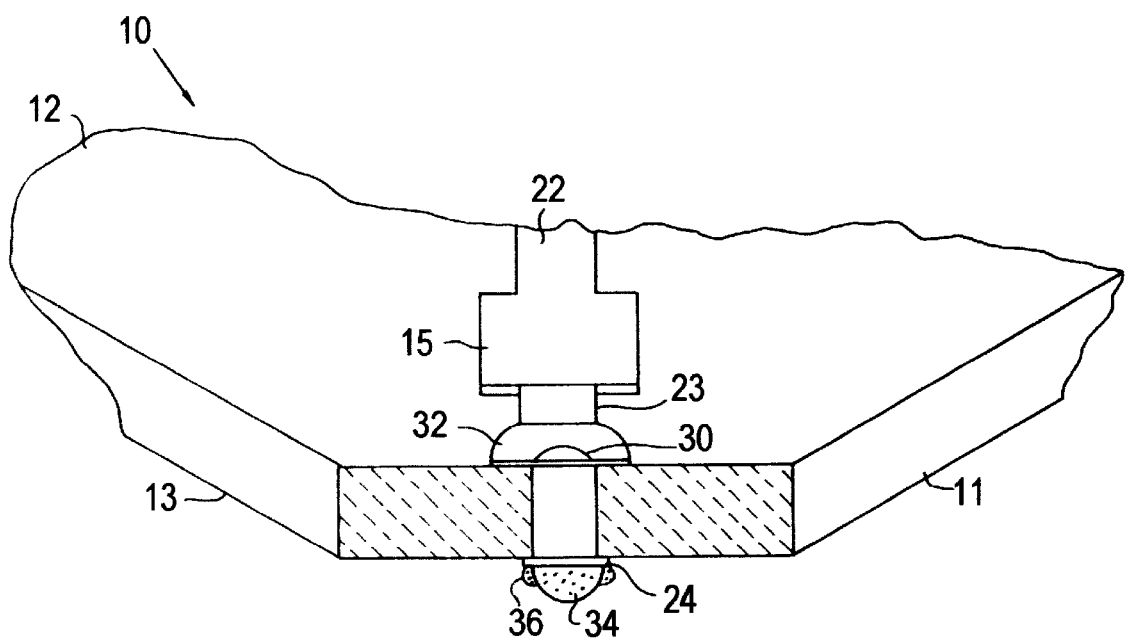
FIG. 2 is a partial perspective cross-sectional view of FIG. 1 along section line 2—2.

Referring to FIGS. 1 and 2, there is a stub series terminated logic ball grid array resistor network assembly 10 shown. In particular, resistor network assembly 10 has a planar substrate 11 having a top surface 12 and a bottom surface 13. The substrate 11 is preferably made out of a ceramic material such as alumina oxide. Resistors 14A, 14B, 14C, 14D and 15A, 15B, 15C, 15D are disposed and trimmed on the top surface 12 by conventional thick film resistor processing techniques. Resistors 14A–D have a first end 16 and a second end 17. Resistors 15A–D have a third end 18 and a fourth end 19.

The ceramic substrate 11 has cylindrical vias formed therein and which extend through the substrate 11 and are filled with a conductive via fill. The via fill material is a conventional thick film conductor that is screened into the vias and fired. There are three different vias, a common via 26 extends through the substrate 11 as does a first via 28 and a second via 30. A via pad 32 surrounds each via. Via pad 32 is formed from a conventional thick film conductor material.

A common conductor 20 is located on the top surface 12 using conventional thick film conductor processing techniques. Common conductor 20 is electrically connected to the first end 16 of resistors 14A–D. Common conductor 20 and resistors 14A–D slightly overlap and sinter to form a mechanical and electrical bond during processing. A first conductor 21 is located on top surface 12 and is electrically connected between end 17 of resistors 14A–D and via pad 32 of via 28. A second conductor 22 is located on top surface 12 and is electrically connected between end 18 of resistors 15A–D and via pad 32 of via 28. A third conductor 23 is located on top surface 12 and is electrically connected between end 19 of resistors 15A–D and via pad 32 of via 30.

A bottom conductor 24 is located on bottom surface 13 connected to vias 26, 28 and 30. The vias electrically connect the top and bottom conductors. Solder spheres 34 are mechanically and electrically attached to the bottom conductors 24. The solder spheres are 10% tin and 90% lead and are commercially available from Alpha metals corporation. The solder spheres 34 are attached to the conductors 24 by a reflowed solder paste 36. The reflowed solder paste is 37% lead and 63% tin which has a lower melting point than the solder spheres 34. A protective coating 36 is placed over the resistors, the conductors and the common conductor to protect the resistor network from corrosion and abrasion. The protective coating 36 is partially shown covering one of vias 30.

A terminating voltage Vt is applied to the common via 26 through sphere 34 where the sphere 34 connects to an external electrical circuit such as on a printed circuit board. Second vias 30 are connected through sphere 34 to output buffers of a driving circuit. The second vias could be viewed as an input terminal. First vias 28 are connected through sphere 34 to receiver inputs of a receiving circuit. The first vias could be viewed as output terminals.

The common conductor 20 has a star shape and the common via 26 is generally located near the center of the star shape. The star shape provides a short common connection to the terminating voltage which is connected to the solder sphere 34 through via 26 and minimizes inductance of the common conductor 20 which minimizes cross talk noise between the resistor/conductor pairs.

Resistor network assembly 10 can be assembled by the following process sequence:
1. Screen vias 26, 28 and 30 in substrate 11 with a via fill material.
2. Fire in oven.
3. Screen conductors 20, 21, 22, 23 and via pads 32 onto top surface 12.
4. Fire in oven.
5. Screen bottom conductor 24 onto bottom surface 13.
6. Fire in oven.
7. Screen resistors 14A–D and 15A–D onto top surface 12.
8. Fire in oven.
9. Laser trim resistors to proper resistance value.
10. Screen and cure cover coat 38.
11. Screen solder paste 36 onto conductor 24.
12. Place solder spheres 34 onto conductor 24.
13. Reflow solder paste 36 to bond spheres 34 to conductors 24.
14. Test assembly 10.

Figure 3:
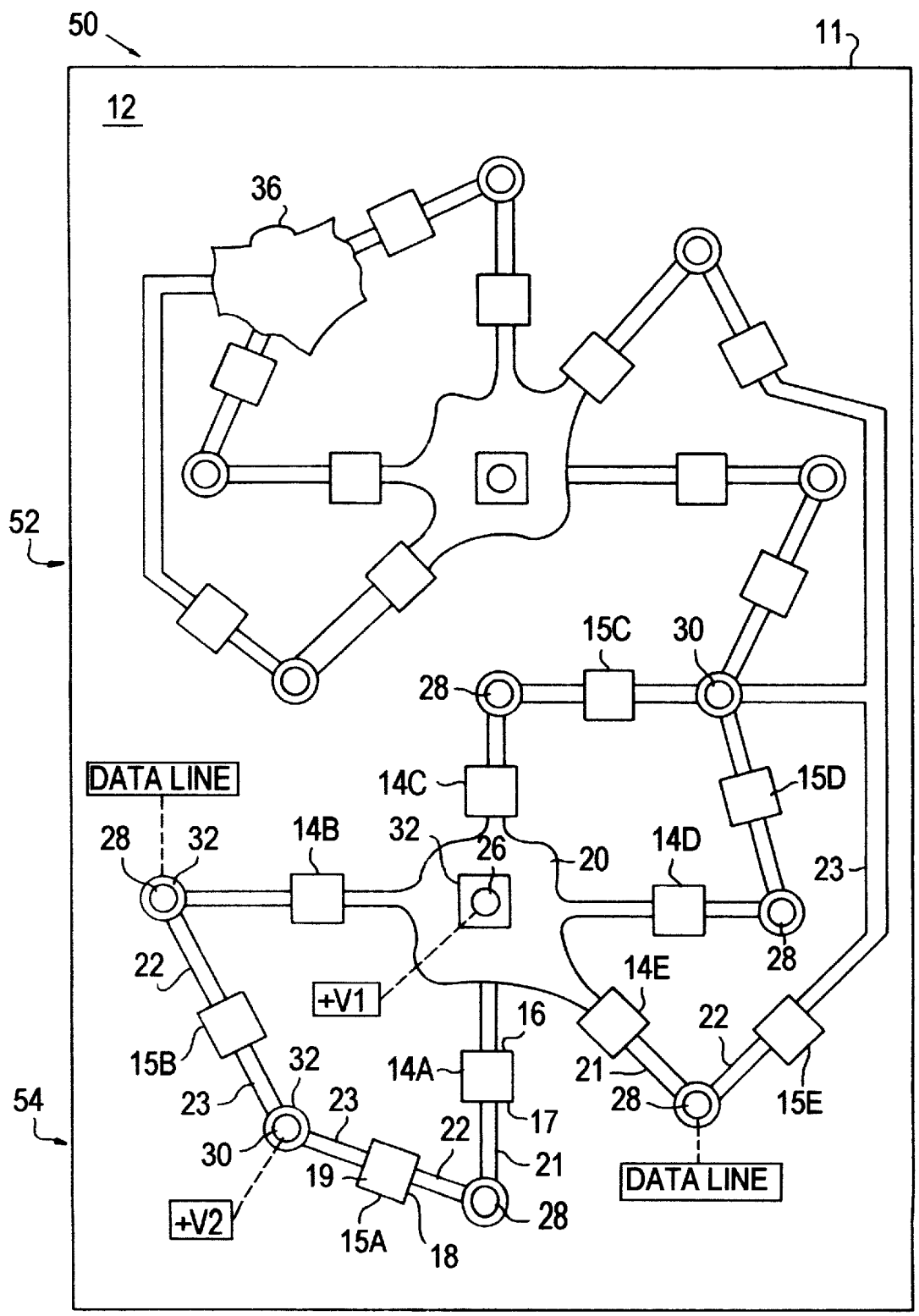
FIG. 3 is a top view of a ball grid array resistor network for terminating emitter coupled logic circuits.

Referring to FIGS. 2 and 3 a top view of a ball grid array resistor network assembly 50 for terminating emitter coupled logic circuits is shown. Resistor network assembly 50 has two pairs of sub-networks 52 and 54. Sub-networks 52 and 54 are similar to network 10 except that sub-networks 52 and 54 are connected at one point and the external circuit connections are different. Resistor network assembly 50 has a planar substrate 11 having a top surface 12 and a bottom surface 13. The substrate 11 is preferably made out of a ceramic material such as alumina oxide. Resistors 14A, 14B, 14C, 14D, 14E and 15A, 15B, 15C, 15D, 15E are disposed and trimmed on the top surface 12 by conventional thick film resistor processing techniques. Resistors 14A–E have a first end 16 and a second end 17. Resistors 15A–E have a third end 18 and a fourth end 19.

The ceramic substrate 11 has cylindrical vias formed therein and which extend through the substrate 11 and are filled with a conductive via fill. The via fill material is a conventional thick film conductor that is screened into the vias and fired. There are three different vias, a common via 26 extends through the substrate 11 as does a first via 28 and a second via 30. A via pad 32 surrounds each via. Via pad 32 is formed from a conventional thick film conductor material.

A common conductor 20 is located on the top surface 12 using conventional thick film conductor processing techniques. Common conductor 20 is electrically connected to the first end 16 of resistors 14A–E. Common conductor 20 and resistors 14A–E slightly overlap and sinter to form a mechanical and electrical bond during processing. A first conductor 21 is located on top surface 12 and is electrically connected between end 17 of resistors 14A–E and via pad 32 of via 28. A second conductor 22 is located on top surface 12 and is electrically connected between end 18 of resistors 15A–E and via pad 32 of via 28. A third conductor 23 is located on top surface 12 and is electrically connected between end 19 of resistors 15A–E and via pad 32 of via 30. It is noted that networks 52 and 54 are joined between resistors 15E by conductor 23.

A bottom conductor 24 is located on bottom surface 13 connected to vias 26, 28 and 30. The vias electrically connect the top and bottom conductors. Solder spheres 34 are mechanically and electrically attached to the bottom conductors 24. The solder spheres are 10% tin and 90% lead and are commercially available from alpha metals corporation. The solder spheres 34 are attached to the conductors 24 by a reflowed solder paste 36. The reflowed solder paste is 37% lead and 63% tin which has a lower melting point than the solder spheres. A protective coating 36 is placed over the resistors, the conductors and the common conductor to protect the resistor network from corrosion and abrasion. The protective coating 36 is partially shown covering one of vias 30.

In an emitter coupled logic circuit two terminating voltages are used. We shall designate these voltages Va and Vb. Terminating voltage Vb is applied to the common via 26 through sphere 34 where the sphere 34 connects to an external electrical circuit such as on a printed circuit board. Second vias 30 are connected through sphere 34 to terminating voltage Va. First vias 28 are connected through sphere 34 to the data line to be terminated.

The common conductor 20 has a star shape and the common via 26 is generally located near the center of the star shape. The star shape provides a short common connection to the terminating voltage which is connected to the solder sphere 34 through via 26 and minimizes inductance of the common conductor 20 which minimizes cross talk noise between the resistor/conductor pairs.

Resistor network assembly 50 is assembled in the same manner as for assembly 10.

Variations of the Preferred Embodiment(s)

One of ordinary skill in the art of making resistors, will realize that there are many different ways of accomplishing the preferred embodiment. For example, although it is contemplated to make substrate 11 out of ceramic, other suitable materials would work, like polyamide or FR4. These materials would require a different resistor system. Additionally, although certain numbers of resistors were shown on substrate 11. More or fewer resistors could be used.

It is further possible to have other electrical connections through the substrate other than conductor filled vias, It is possible to use staked copper or metal pins in place of the vias.

Even though, the specification has shown the common conductor 20 as having a star shape, other shapes are contemplated such as a star with anywhere from 2 to 100 points. The specification showed the common via 26 located near the center of the star shape. It is contemplated to place the common via 26 at other locations such as near the edge of the common conductor 20 or on one of the points of the star shape.

The specification has shown the resistor network assembly 10 with a cover coat 38. It is contemplated, however, to omit the cover coat.

Another variation of the preferred embodiment is to use other types of solder preforms in place of solder spheres 34. For example, solder donuts or wire or squares could be used. Further, the solder could be made from materials other than 10/90 tin lead. For example, a mixture of tin/indium or tin/bismuth could be used if a lower melting solder is desired. A mixture of tin/silver or tin/antimony could be used if a higher temperature solder is desired.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A resistor termination network for stub series terminated logic, comprising:
   a) a substrate having a first and a second surface;
   b) a common via, extending through the substrate;
   c) a common conductor located on the first surface surrounding the common via;
   d) a first via, extending through the substrate;
   e) a second via, extending through the substrate;
   f) a first conductor connected to the first via;
   g) a second conductor connected to the first via;
   h) a third conductor connected to the second via
   i) a plurality of resistor pairs located on the first surface, surrounding the common conductor, each resistor pair including:
      h1) a first resistor connected between the common conductor and the first conductor;
      h2) a second resistor connected between the second conductor and the third conductor;
   j) a plurality of bottom conductors located on the second surface and connected to one of the vias;
   k) a plurality of solder spheres, disposed on the second surface, each of the solder spheres electrically connected to one of the bottom conductors; and
   l) a protective coating disposed over the first surface.

2. A resistor termination network for terminating emitter coupled logic circuits, comprising:
   a) a substrate having a first and a second surface;
   b) a common via, extending through the substrate, the common via connected to a first termination voltage;
   c) a common conductor surrounding the common via and electrically connected thereto;
   d) a first group of resistors located on the first surface, surrounding the common conductor, each having a first end and a second end, the first ends connected to the common via by a first conductor;
   e) a first group of vias, extending through the substrate and connected to the second ends, the first group of vias connected to a data line;
   f) a second group of resistors located on the first surface, in proximity to the first group of vias, each having a third end and a fourth end, the third ends connected to the first group of vias, respectively by a second conductor;
   g) a second group of vias, extending through the substrate and connected to the fourth ends, the second group of vias connected to a second termination voltage by a third conductor;
   h) a plurality of bottom conductors located on the second surface and connected to one of the vias;
   i) a plurality of solder spheres, disposed on the second surface, each of the solder spheres electrically connected to one bottom conductors
   j) a protective coating disposed over the first surface.

* * * * *